United States Patent [19]

Kwok et al.

[11] 4,396,437

[45] Aug. 2, 1983

[54] SELECTIVE ENCAPSULATION, CONTROLLED ATMOSPHERE ANNEALING FOR III-V SEMICONDUCTOR DEVICE FABRICATION

[75] Inventors: Siang P. Kwok; Milton Feng, both of Rancho Palos Verdes; Victor K. Eu, Redondo Beach, all of Calif.

[73] Assignee: Hughes Aircraft Company, El Segundo, Calif.

[21] Appl. No.: 260,455

[22] Filed: May 4, 1981

[51] Int. Cl.³ .................. H01L 21/265; H01L 21/324
[52] U.S. Cl. .................................... 148/1.5; 29/590; 29/576 B; 148/175; 148/187; 357/61; 357/91
[58] Field of Search ..................... 148/1.5, 187, 175; 357/61, 91; 29/590, 576 B

[56] References Cited

U.S. PATENT DOCUMENTS

| 3,984,263 | 10/1976 | Asao et al. | 148/175 |
| 4,058,413 | 11/1977 | Welch et al. | 148/1.5 |
| 4,312,681 | 1/1982 | Rupprecht et al. | 148/1.5 |
| 4,327,475 | 5/1982 | Asai et al. | 357/61 |
| 4,357,180 | 11/1982 | Molnar | 148/1.5 |

OTHER PUBLICATIONS

Kasahara et al., J. Appl. Phys. 50, (1979), 541.
Malborn, J. Electrochem. Soc. 123, (1976), 1413.
Lee et al., in Ion Implantation in Semiconductors, 1976, Ed. Chernow et al., Plenum, N.Y., p. 115.
Donnelly et al., Solid State Electronics, 20, (1977), 273.

*Primary Examiner*—Upendra Roy
*Attorney, Agent, or Firm*—David W. Collins; W. J. Bethurum; A. W. Karambelas

[57] ABSTRACT

A post-ion implantation annealing technique is provided to remove implantation damage in the active region of III-V (e.g., GaAs) semiconductor devices formed in a III-V semi-insulating substrate and separated by a field region. The technique involves applying a dielectric encapsulation selectively over the device active area and annealing in a controlled reducing atmosphere which includes the Group V element (e.g., arsenic). The dielectric encapsulant over the active region permits migration of the species employed to render the substrate semi-insulating (e.g., Cr in GaAs substrates), thereby resulting in high carrier mobility in the active region. Without encapsulation, migration of the species in the field region is substantially suppressed, thereby resulting in good inter-device isolation.

9 Claims, 9 Drawing Figures

SELECTIVE ENCAPSULATION, CONTROLLED ATMOSPHERE ANNEALING FOR III-V SEMICONDUCTOR DEVICE FABRICATION

BACKGROUND OF THE INVENTION

1. Field of the Invention

This invention relates to fabrication of III-V semiconductor devices having an active region, and, more particularly, to a post-ion implantation annealing technique to remove implantation damage in the device active region.

2. Description of the Prior Art

Currently, two approaches to GaAs integrated circuit (IC) technology used in the industry include mesa technology with a recessed gate and planar technology with multiple, localized ion implantations. The mesa with recessed gate technology suffers from ultimate density and yield limitations associated with the mesa structures. Thus, the main application of this technology has only been directed towards ultra high speed, medium scale integration (MSI) circuits and ultra low power, enhancement mode field effect transistor (ENFET) logic. The planar technology, with multiple localized ion implantation, has been applied successfully to fabricate large scale integrated (LSI) circuits with 1,000 gate chips on chromium-doped substrates. The process involves ion implantation through an encapsulation dielectric, which is subsequently used as an annealing encapsulation, and a metal lift-off vehicle. The process is suitable for multiple metal layered structures. However, there are inherent problems associated with dielectric encapsulation annealing. Dielectric encapsulation exerts a significant stress at the GaAs interface, which in turn induces significant migration of background Cr and other impurities during high temperature annealing. As a result, the semi-insulating, or high resistivity, GaAs substrate becomes conductive, resulting in poor inter-device isolation. To cope with this Cr migration problem, the annealing temperature must be kept sufficiently low (below about 860° C.), and stringent material qualification processes and tight process controls on the dielectric encapsulant must be used, to some degree resulting in yield losses.

SUMMARY OF THE INVENTION

In accordance with the invention, a process is provided for fabricating III-V semiconductor devices having an active region and formed on a III-V substrate rendered semi-insulating by a species. In processes which include at least one ion implantation step, the improved process includes removing implantation damage by the following steps:

(a) forming a layer of dielectric material on the active region, the dielectric material capable of gettering the species; and (b) annealing in a reducing atmosphere including the Group V element at a temperature and for a time sufficient to substantially remove all implantation damage in the active region.

Use of the foregoing process suppresses migration of the species, e.g., Cr, in regions without dielectric encapsulation during high temperature annealing up to 900° C. Consequently, preservation of excellent interdevice isolation of planar structures is realized by leaving those areas exposed. On the other hand, migration of the species occurs in the active region, with the result that good carrier activation efficiency and high mobility in the device active region are obtained.

DETAILED DESCRIPTION OF THE INVENTION

The process described below is set forth in terms of GaAs devices having an active region and formed on a Cr-doped semi-insulating GaAs substrate. However, it will be appreciated that the process of the invention is also applicable to other III-V devices having an active region and formed on III-V semi-insulating substrates, such as Fe-doped InP.

Figures 1A, 1B:
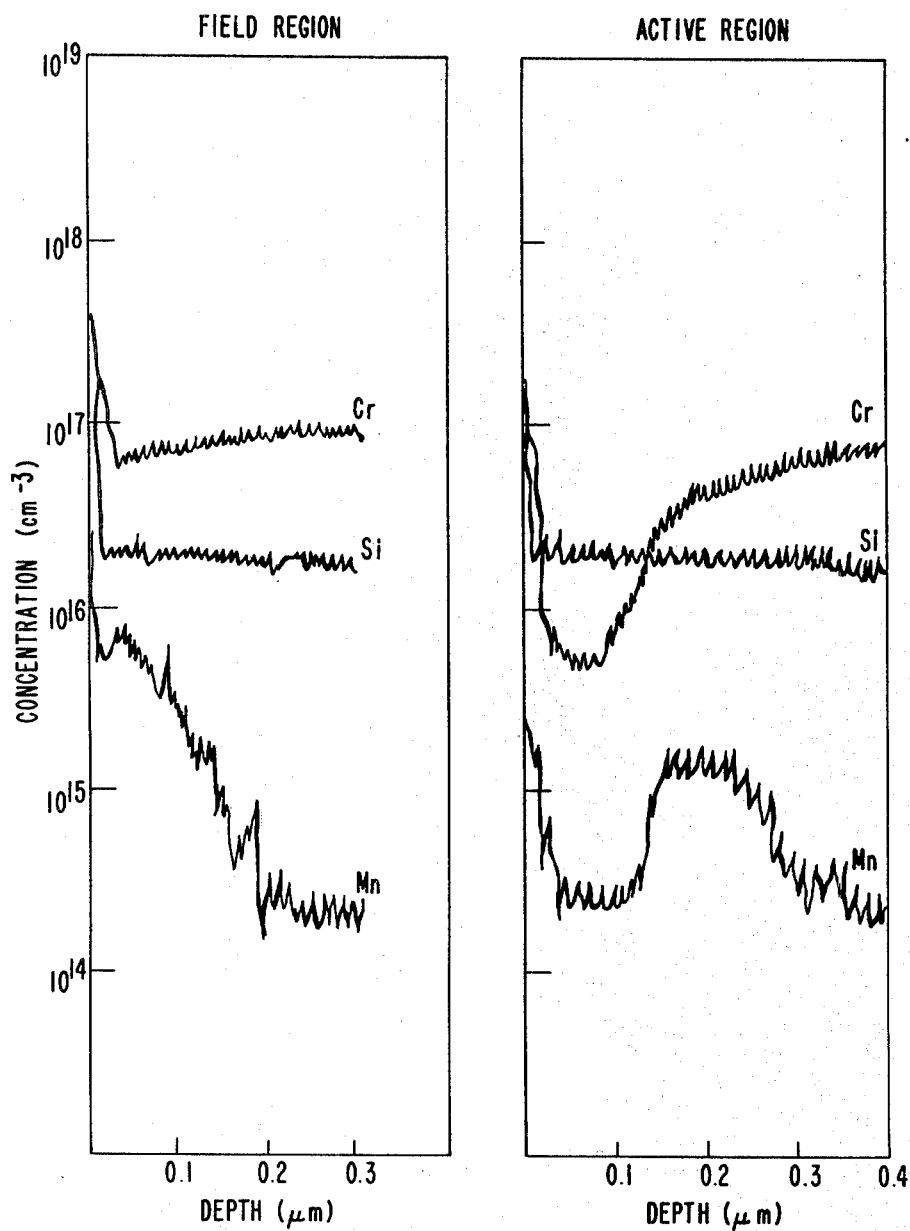
FIG. 1, on coordinates of concentration in $cm^{-3}$ and depth in $\mu m$ into the semiconductor surface, depicts the redistribution of Cr, Si and Mn after annealing in a controlled atmosphere (FIG. 1a) and in a controlled atmosphere plus a dielectric encapsulant (FIG. 1b)

Present post-ion implantation high temperature annealing techniques for chromium-compensated GaAs semi-insulating substrates using dielectric encapsulation suffer, in varying degrees, from surface electrical conversion. This conversion is largely attributed to the redistribution and depletion of the background chromium impurities to a depth of about 0.5 $\mu m$ from the surface, resulting in poor isolation between devices (field region). Controlled atmosphere annealing in accordance with the invention prevents such chromium redistribution, leaving the substrates semi-insulating. FIG. 1 shows the chemical distributions of chromium impurities in two chromium-compensated GaAS unimplanted semi-insulating substrates ($\geq 10^7$ $\Omega$-cm) annealed under a controlled atmosphere of $As_4$ and $H_2$ at 860° C. with and without an encapsulant of $SiO_2$ (FIGS. 1b and 1a, respectively). There is a considerable depletion of chromium impurities near the surface of the substrate under $SiO_2$ encapsulation, while only a negligible amount of depletion occurs without encapsulation. Formation of two ohmic contact pads, 325 $\mu m$ apart on semi-insulating GaAs substrates annealed under a controlled atmosphere at 830° C., 850° C. and 860° C. for twenty minutes has evidenced negligible leakage currents at applied voltages in excess of 100 Volts, indicating excellent isolation between the ohmic contact pads. However, the presence of large amounts of chromium impurities in the device active region tends to reduce the carrier mobility, because of impurity scattering. The use of selective encapsulation in conjunction with controlled atmosphere annealing permits use of a dielectric capping locally on the device active region to enhance carrier mobility arising from the chromium depletion while leaving the field region semi-insulating for inter-device isolation.

Further, because no surface conversion takes place in controlled atmosphere annealing even at high temperatures in excess of 860° C., it is possible to anneal out heavily implanted damage for formation of an $n^+$ region and low resistance ohmic contacts. Thus, the selective encapsulation controlled atmosphere annealing technique of the invention is suitable for fabrication of high density GaAs planar integrated circuits employing selective ion implantation.

An investigation of silicon-implanted semi-insulating substrates under controlled atmosphere annealing with and without $SiO_2$ encapsulation reveals similar results. Si-implanted substrates (e.g., implantation at 100 KeV under a fluence of $6\times10^{12}$ cm$^{-2}$) evidence depletion near the surface and redistribution of Cr at annealing temperatures of 830° and 860° C. for 20 min with $SiO_2$ encapsulation; indeed, the Cr concentration in this region is less than the background Si concentration. Without $SiO_2$ encapsulation, the Cr concentration remains relatively constant as a function of depth for both annealing conditions.

Use of selective encapsulation controlled atmosphere annealing has also been applied to sulfur implantation (e.g., 350 KeV at $1\times10^{13}$ cm$^{-2}$ fluence), since sulfur evidences a high diffusivity in GaAs. Under an encapsulant of $SiO_2$ and annealing conditions of 860° C. and 880° C. for 20 min, a peak carrier concentration in excess of $1\times10^{17}$ cm$^{-3}$ and profile depth of 0.6 $\mu$m have been obtained. Carrier concentrations greater than $1\times10^{18}$ cm$^{-3}$ have been obtained with an implant dosage of 350 KeV and $5\times10^{14}$ cm$^{-2}$ fluence, annealed at 860° C. and 880° C. An Au:Ge/Ni/Au ohmic contact formed on the resultant n+ region has resulted in a very low specific ohmic contact resistance of about $5\times10^{-7}$ $\Omega$-cm$^{-2}$.

An example of employing selective encapsulation controlled atmosphere annealing for the fabrication of GaAs planar ICs using selective ion implantation is set forth in FIGS. 2a–g. The sequence of Figures depicts a single device formed on a substrate. However, it will be appreciated that a plurality of such devices are formed on a substrate, as is well-known, separated by a field region.

Figure 2A:
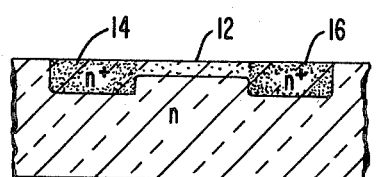
FIGS. 2a–g depict, in cross-section, the sequence of steps in forming a planar IC device by a process which includes the process of the invention.
Figure 2D:
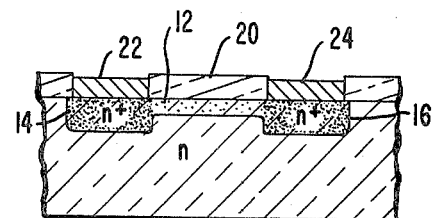
Figure 2B:
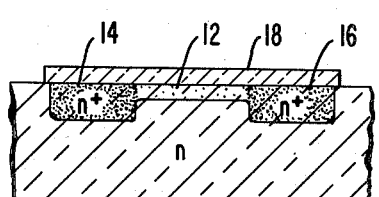

Selective ion implantation is employed to form an n-channel region 12 and n+ ohmic contact regions 14, 16 in semi-insulating substrate 10, as shown in FIG. 2a. Chromium-doped semi-insulating substrates are commercially available and are suitably employed in the practice of the invention. Selective dielectric capping 18 is applied over the active region, which includes the channel region and the ohmic contact regions, as shown in FIG. 2b. The material comprising the dielectric capping may be any dielectric material having a gettering capability for the ion species of interest, here, Cr. Examples include silicon dioxide ($SiO_2$), silicon nitride ($Si_3N_4$) and mixtures thereof (i.e., silicon oxynitride). The dielectric material is deposited on the semiconductor surface using conventional processing techniques, but preferably is deposited by a low temperature process, in order to avoid premature migration of Cr ions. For example, $SiO_2$ may be deposited by the well-known low temperature chemical vapor deposition process (silane plus oxygen in an oxidation furnace) at about 300° to 450° C. The dielectric layer is deposited to a thickness ranging between about 50 and 3,000 Ångstroms. Layers thicker than about 3,000 Å are more difficult to process photolithographically and induce excessive stress at the GaAs/$SiO_2$ interface, while layers thinner than about 50 Å will not form an effective encapsulant. Preferably, the dielectric layer 18 is deposited to a thickness of about 1,000 Å to 2,000 Å.

The wafer is then annealed in a controlled reducing atmosphere including arsenic as $As_4$ (Group V element). Preferably, the reducing atmosphere comprises a mixture of hydrogen and arsenic for GaAs devices. The partial pressure of the Group V component must be sufficient to provide an amount of the Group V component effective to avoid depletion of chromium near (within about a few tenths of a micrometer) the surface of the field region, since an insufficient partial pressure results in undesired redistribution of chromium and hence poor inter-device isolation. Where the Group V component is $As_4$, an example of a suitable partial pressure is 0.02 atm. Economics of processing dictate the maximum amount of $As_4$ (or other Group V element) employed. The annealing is carried out at a temperature between about 800° and 900° C. for a period of time ranging from about 20 to 40 minutes.

Figure 2E:
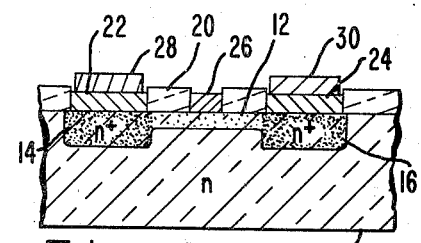
Figure 2C:
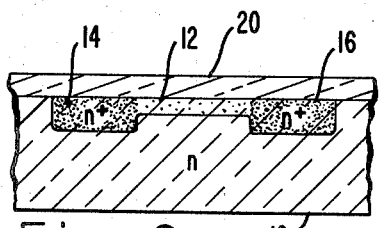

The dielectric capping 18 is partially or completely removed and a field dielectric 20 is deposited by a conventional low temperature process over the entire surface of the wafer. The resulting structure is depicted in FIG. 2c.

Appropriate openings are formed in portions of the field dielectric to expose the ohmic contact regions 14, 16, and an ohmic contact metal 22, 24 is deposited over the ohmic contact regions, employing photoresist lift-off. As is conventional for GaAs devices, the ohmic contact metal comprises Au:Ge/Ni/Au, which is then alloyed in a mixture of $N_2$ and $H_2$ at about 300° to 500° C. to form drain and source ohmic contacts. The resulting structure is shown in FIG. 2d.

A gate Schottky metal 26 and drain-source overlay metal 28, 30 are then deposited using photoresist lift-off techniques. The resulting structure is shown in FIG. 2e.

Figure 2F:
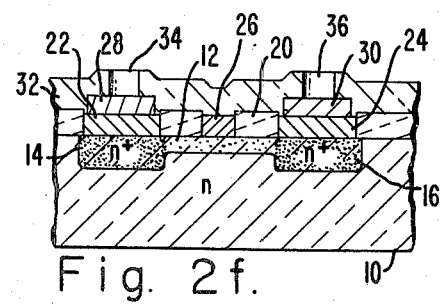
Figure 2G:
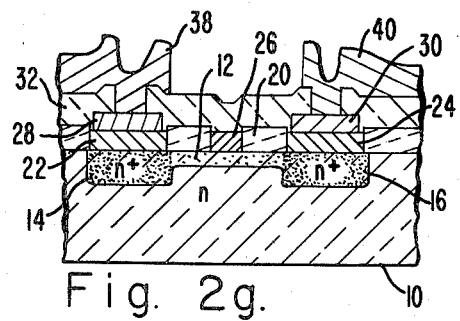

A low temperature isolation dielectric 32 is deposited over the surface and ohmic contact via holes 34, 36 are formed, as shown in FIG. 2f. Interconnection metallization 38, 40 is then deposited, as shown in FIG. 2g to complete fabrication of a typical GaAs FET.

EXAMPLES

Example 1

A semi-insulating Cr-O doped substrate was employed having Cr concentration typically in the range of 0.6 to $2\times10^{17}$ cm$^{-3}$. The dislocation densities were $\leq 10^4$ cm$^{-2}$. The wafer was encapsulated with 1,000 Å $SiO_2$ deposited at 420° C. by the reaction of $SiH_4$ and $O_2$ in a $N_2$ stream and with photoresist process to form the implantation mask. The $^{28}Si^+$ ion implantation dosage for the n+ ohmic contact regions was $1\times10^{13}$ cm$^{-2}$ at 260 KeV. Subsequently, the photoresist and $SiO_2$ were removed. The wafer was then annealed for 20 min at 880° C. in a $H_2$ stream containing $\leq 1$ ppm $H_2O$ and with an arsenic pressure $P_{AS4}=0.021$ atm added as pure $AsH_3$. This arsenic overpressure was at least $10^3$ times the equilibrium $As_4$ pressure needed to prevent the As dissociation of GaAs in a Ga-rich liquid surface saturated with GaAs. Subsequently, a light dose $^{28}Si^+$ implantation with $4\times10^{12}$ cm$^{-2}$ fluence at 100 KeV was used to locally form the channel regions. This time, only photoresist was used as the implantation mask. After implantation, $SiO_2$ was deposited and selectively etched to cover only the active regions. The wafer was subsequently annealed in the same controlled atmosphere as above for 20 min at 860° C.

Drain-source metallization (Au:Ge/Ni/Au) was deposited using the encapsulant $SiO_2$ and photoresist as a lift-off vehicle and then was alloyed in $N_2+H_2$ at 360° C. for 1 min. Gate metallization (Cr/Au/Cr) was deposited using the same $SiO_2$ assisted metal lift-off. The active region was covered by a 2,000 Å layer of $SiO_2$. This $SiO_2$ encapsulant tends to make the metallization coplanar. A dielectric passivation layer of silicon oxynitride was then deposited to isolate the first level metallization from the second one. Via holes were then plasma etched through the passivating dielectric. Finally, a second metallization (Cr/Pd/Au) was deposited, using aluminum assisted lift-off and via hole ion mill cleaning prior to metal deposition.

The current-voltage (I-V) characteristics of a 1 $\mu m \times 100$ $\mu m$ DFET fabricated as above were measured. The transconductance $g_m$ at zero gate bias was 5.5 mmhos. The Hall mobility in the device active region was about 4,000 cm$^2$/V-s. Hence, good device activation was achieved. It should be noted that under $SiO_2$-cap annealing, the compensating Cr concentration was depleted below the substrate background Si impurity concentration, and as a result the substrate converted to n-type. On the other hand, under controlled atmosphere capless annealing, the Cr concentration remained significantly higher than that of Si; thus the substrate remained semi-insulating in those regions. For ohmic contact pads of 125 $\mu m \times 125$ $\mu m$ dimensions approximately 175 $\mu m$ apart, the leakage was negligible at voltages as high as 200 V. This low leakage current is sufficient to fabricate LSI GaAs integrated circuits without additional implantation for isolation purposes.

Example 2

D-flip flop circuits using normally ON MESFETs with 1 $\mu m$ gates were fabricated for divide-by-2 operation of the circuits, employing the process of Example 1. The n-channel was formed using $^{28}Si^+$ ion implantation with 70 to 100 KeV energy and $4 \times 10^{12}$ cm$^{-2}$ fluence; and the n+ region with $^{28}Si^+$ 260 KeV energy and $1 \times 10^{13}$ cm$^{-2}$ fluence. The typical device transconductance for 100 $\mu m$ wide devices with 1.0 to 1.5 volt pinch-off was 5.5 mmhos. Excellent inter-device isolation was obtained: leakage current between the two ohmic contact pads was less than 1.0 $\mu A$ at an electric field strength of 4.5 KV/cm.

What is claimed is:

1. A process for fabricating III-V semiconductor devices having an active region formed on a III-V substrate rendered semi-insulating by a species, said process including at least one ion implantation step, wherein the improvement includes removing implantation damage by the following steps:
   (a) forming a layer of dielectric material over said active region, said dielectric material capable of gettering of said species; and
   (b) annealing the partially coated substrate in a reducing atmosphere including said Group V element at a temperature and for a time sufficient to substantially remove all implantation damage in said active region.

2. The process of claim 1 in which said III-V substrate comprises GaAs and said species comprises Cr.

3. The process of claim 2 in which said reducing atmosphere includes arsenic, whose partial pressure is effective to avoid depletion of Cr near the surface of said III-V substrate.

4. The process of claim 3 in which said reducing atmosphere comprises a mixture of hydrogen and arsenic.

5. The process of claim 1 in which said III-V substrate comprises InP and said species comprises Fe.

6. The process of claim 1 in which said dielectric material is selected form the group consisting of $SiO_2$, $Si_3N_4$ and mixtures thereof.

7. The process of claim 6 in which the thickness of said dielectric material ranges from about 50 to 3,000 Å.

8. The process of claim 7 in which said thickness ranges from about 1,000 to 2,000 Å.

9. The process of claim 1 in which said annealing is performed at a temperature between about 800° and 900° C. for about 20 to 40 minutes.

* * * * *